United States Patent [19]
Lurie et al.

[11] Patent Number: 6,133,733
[45] Date of Patent: Oct. 17, 2000

[54] MAGNETIC RESONANCE IMAGING

[75] Inventors: David John Lurie, Aberdeen; Stephen John McCallum, Southampton; James McDonald Strachan Hutchinson, Aberdeen, all of United Kingdom; Marcello Alecci, Pizzoli, Italy

[73] Assignee: BTG International Limited, London, United Kingdom

[21] Appl. No.: 09/020,422

[22] Filed: Feb. 9, 1998

Related U.S. Application Data

[63] Continuation of application No. PCT/GB96/01901, Aug. 5, 1996.

[30] Foreign Application Priority Data

Aug. 15, 1995 [GB] United Kingdom .................. 9516687

[51] Int. Cl.$^7$ .......................................... G01V 3/00
[52] U.S. Cl. .................................. 324/300; 324/314
[58] Field of Search .................................. 324/300, 306, 324/307, 309, 312, 314, 316

[56] References Cited

U.S. PATENT DOCUMENTS

| | | | |
|---|---|---|---|
| 4,455,527 | 6/1984 | Singer | 324/316 |
| 5,757,187 | 5/1998 | Wollin | 324/306 |

FOREIGN PATENT DOCUMENTS

| | | |
|---|---|---|
| 91 00514 | 1/1991 | WIPO . |
| 92 13283 | 8/1992 | WIPO . |

OTHER PUBLICATIONS

Journal of Magnetic Resonance, vol. 89, No. 2, Sep. 1990, Duluth, MN, US, pp. 431–435, P.B. Barker et al, "Mode–Switched Radiofrequency Coils".

Journal of Physics E Scientific Instruments, vol. 22, No. 11, Nov. 1989, Bristol, GB, pp. 949–951, P.J. McDonald et al, "An NMR Multiple Pulse Sequence for the Imaging of Solids Using Sinusoidally Driven Magnetic Field Gradients".

Magnetic Resonance in Medicine, vol. 24, No. 2, Apr. 1992, Duluth, MN, US, pp. 243–252, T. Vullo et al, "Experimental Design and Fabrication of Birdcage Resonators for Magnetic Resonance Imaging".

Journal of Magnetic Resonance, vol. 91, No. 3, Feb. 15, 1991, Duluth, MN, US, pp. 527–538, P. J. Joseph et al, "A Novel Rotating–Field Coil for Sodium Imaging".

Magnetic Resonsance in Medicine, vol. 32, No. 2, Aug. 1994, Baltimore, MD, US, pp. 206–218, J. T. Vaughan et al, "High Frequency Volume Coils for Clinical NMR Imaging and Spectroscopy".

"Image Formation by Induced Local Interactions: Examples...," Nature, vol. 242, pp. 190–191 (1973).

Abstract of paper, NMR Zeugmatography, Lauterbur et al (1974).

Lauterbur et al, "Magnetic Resonance Zeugmatography,"18$^{th}$ Ampere Cong., Nottingham (1974), pp. 27–29.

Gutowsky et al, "Structural Investigations by Means of Nuclear Magnetism," The Journal of Chemical Physics, vol. 17, No. 10, pp. 972–981 (1949).

Hoch et al, "Imaging of Paramagnetic Centres in Diamond," Solid State Communications, vol. 30, pp. 211–213 (1979).

Hayes et al, "An Efficient, Highly Homogeneous Radiofrequency Coil...," Journal of Magnetic Resonance, vol. 63, pp. 622–628 (1985).

Pople et al, "High–resolution Nuclear Magnetic Resonance," McGraw Hill Series in Advanced Chemistry (1959).

*Primary Examiner*—Louis Arana
*Attorney, Agent, or Firm*—Nixon & Vanderhye

[57] ABSTRACT

In a magnetic resonance apparatus for providing an image of a sample a birdcage resonator 12 is provided with its axis parallel to the magnetic field of the apparatus. A radiofrequency source 36 is connected to the resonator 12 so as to generate a magnetic field by a first resonance mode of the resonator and a detector 44, 46 is connected to the resonator 12 so as to detect any signal received by the resonator in its second, orthogonal mode.

6 Claims, 4 Drawing Sheets

MAGNETIC RESONANCE IMAGING

This application is a continuation of PTC/GB96/01901 filed Aug. 5, 1996.

This invention relates to an improved method and apparatus for imaging samples, using either Nuclear Magnetic Resonance (NMR) techniques or Electron Paramagnetic Resonance techniques.

The principle of NMR was first developed in 1946, and the technique of field gradients originated in 1973. In early arrangements, resonance in a swept field was detected either by a single coil resonator (bridge method) or a double coil resonator, i.e. with two coils at right angles (induction method). Both methods are disclosed in "High-resolution Nuclear Magnetic Resonance" by J. A. People et al., McGraw Hill, on pages 52 and 54.

NMR is now widely used for imaging liquids and liquid-like material such as biological tissues, in which NMR spin-spin relaxation times $T_2$ are in the millisecond range. Such long relaxation times allow the use of pulsed Fourier transform NMR with pulsed magnetic field gradients, and good quality images with high spatial resolution can be obtained in a short time. In solids, the NMR lines are much broader and $T_2$ is very much shorter. Nevertheless several techniques have been developed to provide images of solids using NMR. The techniques include multi-pulse line narrowing and Stray Field Imaging, STRAFI, but such techniques are severely restricted by limitations of available radio frequency (RF) power to produce sufficiently short pulses; the result is that the size of sample which can be imaged is small, approximately 10 millimetres, as the power increases as at least the cube of sample dimensions. In addition, STRAFI requires the sample to be translated by small distances between NMR excitations, which is difficult with large objects.

Magic angle spinning has also been used but requires the sample to be spun rapidly within the magnet, which clearly imposes restrictions on sample size and geometry. Another technique is the oscillating gradient method, but this requires very strong gradients to be generated, which again limits sample size as the DC gradient power requirement increases as the fifth power of the coil dimensions.

In all of the above techniques for imaging solids, there is the further restriction that they can be used only if the spin-spin relaxation time $T_2$ is greater than about 10 microseconds.

In a different approach, swept-field continuous wave (CW) NMR has been used to perform NMR spectroscopy of solids since 1949, see The Journal of Chemical Physics, Vol. 17, No. 10, October 1949, H. S. Gutowsky et al. Swept field pulsed NMR has also been used for spectroscopy, with the magnetic field swept in step-wise manner, and low intensity RF pulses applied to detect NMR resonance. In yet another spectroscopic technique, a series of pulses of increasing or decreasing frequency has been applied at constant magnetic field; this technique of variable pulse frequency swept field NMR has been used for wide line NMR spectroscopy.

In a different technology, electron paramagnetic resonance (EPR), a sample is continuously irradiated with electromagnetic radiation, and an applied magnetic field is swept past the likely resonances. The technique of continuous wave (CW) EPR has been known since 1979 and has been developed more recently to provide images of free radicals in biological systems, and for spatial localisation of paramagnetic centres in solids, as disclosed by M. J. R. Hoch and A. R. Day in Solid State Communications 1979, Vol. 30, pages 211–213.

It is an object of the invention to provide apparatus for imaging solids using NMR techniques but without the previously-applicable limitations of sample size and of spin-spin relaxation time.

It is a further object of the invention to provide apparatus for imaging in vivo samples using EPR technique which is less sensitive to sample movement than the conventional reflection bridge methods.

According to the invention, apparatus for providing a magnetic resonance image of a sample comprises:

means for providing a magnetic field having:

first, homogeneous, component, a second, gradient, component which varies in strength across the sample, and a third, swept, component which varies in strength with time, the second and third components being parallel to the first component and being of substantially lower magnitude;

a birdcage resonator arranged within the magnetic field with its axis parallel to the field;

means to connect a radio-frequency source to the resonator so as to generate a magnetic field in a first resonance mode of the resonator, and means to connect detection means to the resonator so as to detect any signal received by the resonator in its second, orthogonal resonance mode.

Optionally the connections between the resonator and the source and the resonator and the detection means are inductive connections, but alternatively they may be capacitive connections.

Optionally the means to provide the third component of the magnetic field comprises means to supply a ramp signal to the ZO coils of a conventional superconducting NMR magnet.

The apparatus may be arranged to operate by the technique of nuclear magnetic resonance, or by the technique of electron paramagnetic resonance.

The invention will now be described by way of example only with reference to the accompanying drawings, in which.

Figures 1A, 1B:
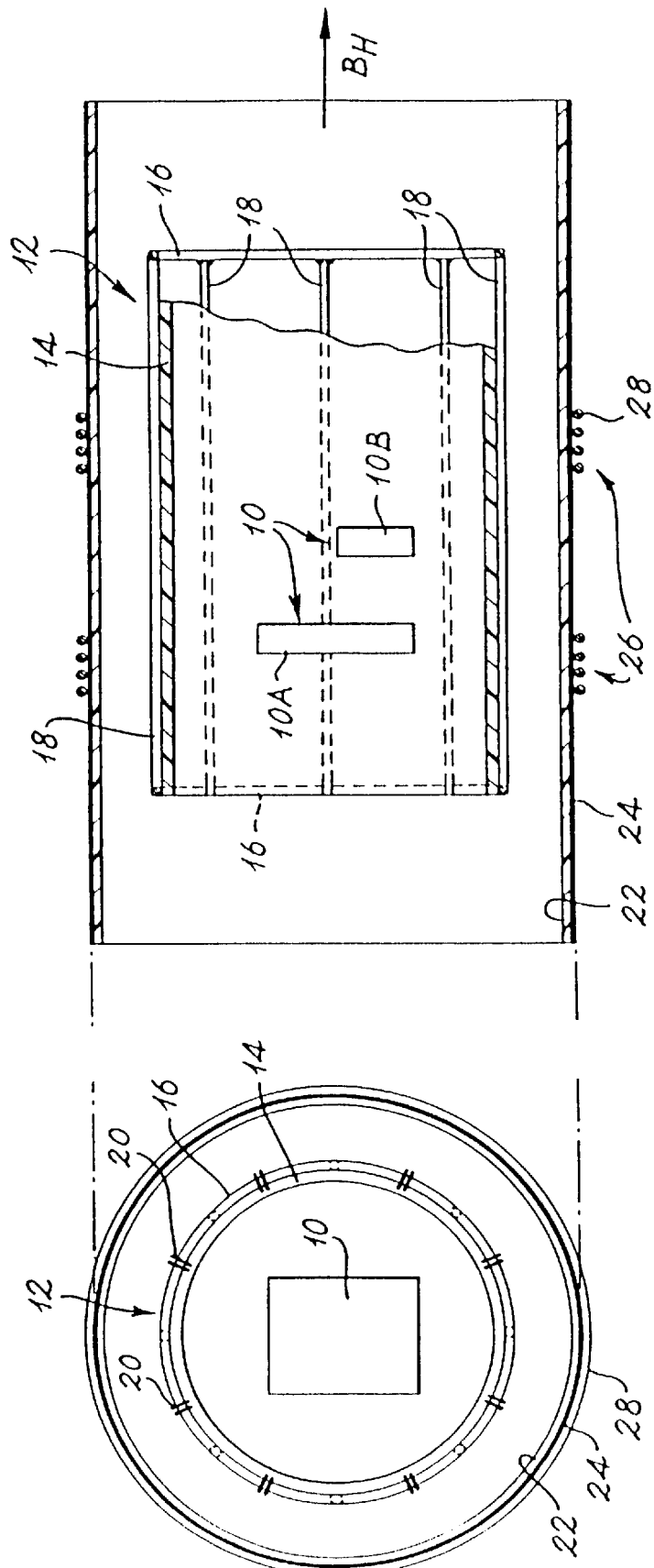
FIG. 1 is an end view and schematic axial section of a solid sample in position within a resonator and field modulation coils.

In FIG. 1 a sample 10, comprising two blocks 10A, 10B, is shown inside a high-pass birdcage resonator 12. The resonator comprises a first cylindrical polymethyl methacrylate (PMMA) former 14 carrying two conducting end rings 16 joined by eight conducting legs 18. Between the junctions of the end rings and each adjacent pair of legs is a variable capacitor 20, shown schematically.

Arranged coaxially around the resonator 12 is a second cylindrical PMMA former 22 on the outer surface of which is a radio frequency shield 24 in the form of a 25 μm layer of copper foil. The former 22 carries magnetic field modulation coils 26 in the form of a split solenoid; turns of e.g. 1 mm copper wire 28 with PVC insulation are wound on the former; although only two sets of four turns are shown, in practice a greater number, e.g. ten turns, would be used.

Figure 2:
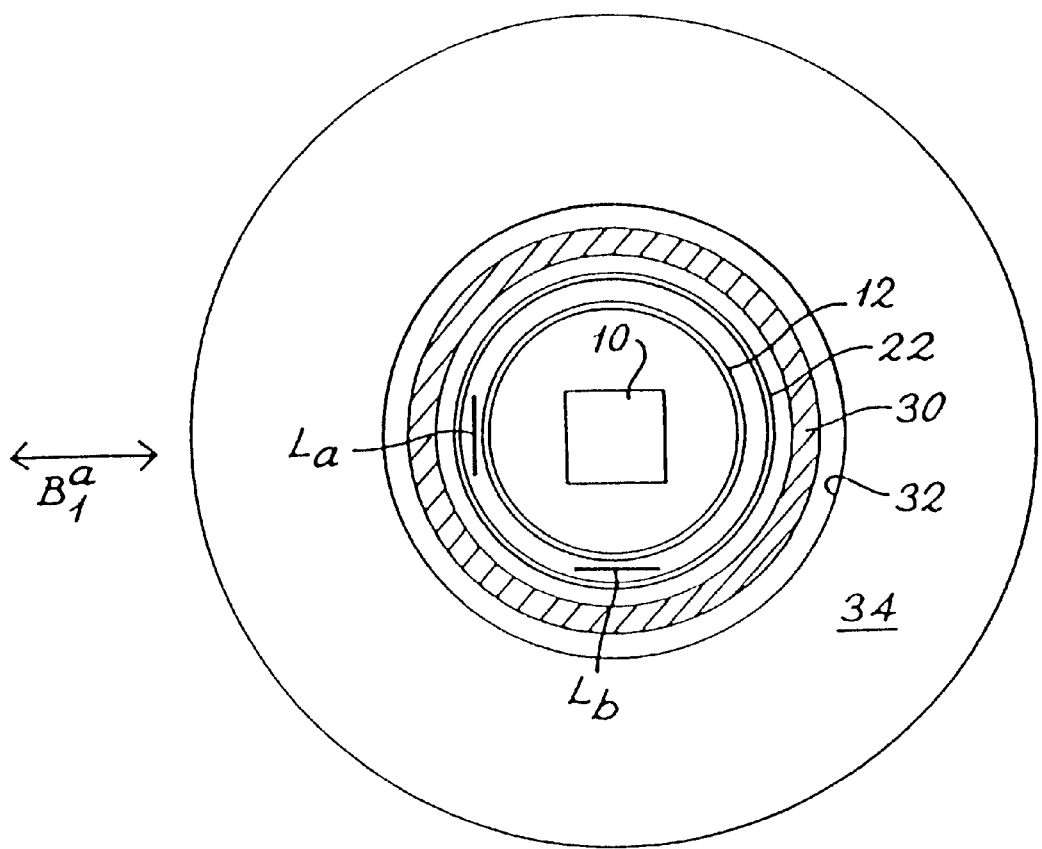
FIG. 2 is a schematic end view of the sample, resonator and coils within the bore of a magnet.

In FIG. 2 the sample 10, birdcage resonator 12 and the former 22 for the field modulation coils are shown positioned within the various coils 30 within the bore 32 of a superconducting magnet 34. The coils 30, shown shaded, include the room temperature shim, gradient and ZO coils of a conventional NMR magnet. The magnet provides an axial magnetic field, shown as $B_H$ in FIG. 1.

FIG. 2 also illustrates, in highly schematic form, the inductive coupling loops $L_a$, $L_b$, situated between the resonator 12 and the radio-frequency shield 24 carried by the former 22. Each loop is connected to a coaxial cable (not shown) for connection to the circuit in FIG. 3. Neither the loops nor the cable are shown in FIG. 1 for reasons of clarity, but in FIG. 2 the direction of the field $B_1{}^a$ by the loop $L_a$ is indicated.

In an alternative arrangement (not illustrated), the resonator may be capacitively coupled to the rest of the apparatus.

Figure 3:
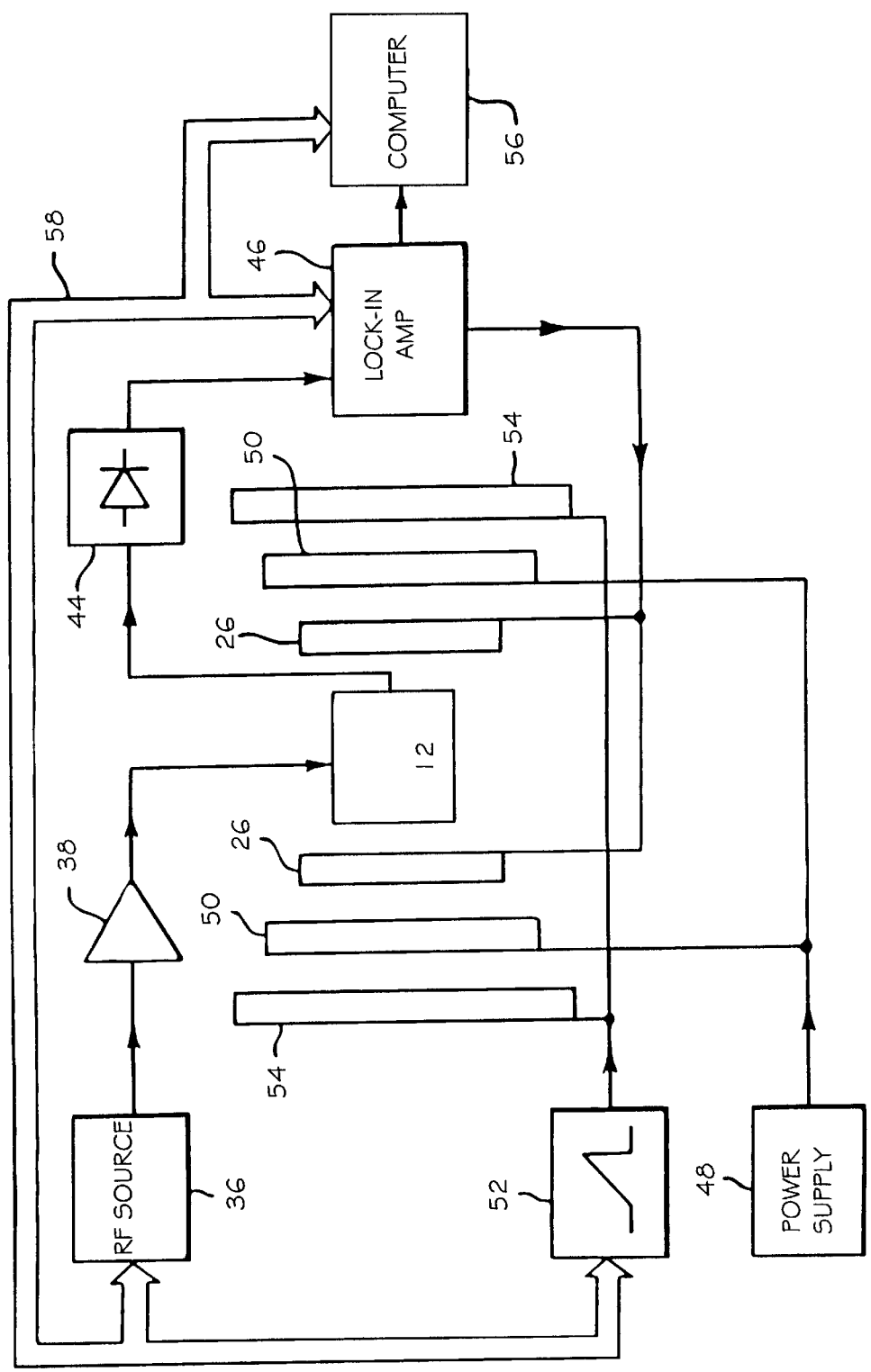
FIG. 3 illustrates schematically an NMR apparatus according to the invention.

FIG. 3 shows the electrical equipment used to provide a one-dimensional image of the sample 10.

An RF source 36 is connected through a power amplifier 38 to the inductive coupling loop $L_a$ of the birdcage resonator 12, and the inductive coupling loop $L_b$ of the resonator is connected through a DC biassed diode detector 44 to a lock-in amplifier 46. The amplifier 46 is connected to the field modulation coils 26 and to a computer 56.

A DC power supply unit 48 is connected to the field gradient coils 50 of the magnet 34, and a field ramp controller or sweep generator 52 supplies the ZO field offset coils 54 of the magnet 34; the magnet is not shown in this Figure.

The computer 56, through a bus 58, controls the amplifier 46, the RF source 36, and the sweep generator 52.

In operation, the RF source 36 generates a constant amplitude sinewave at about 300 MHz; the signal is amplified by amplifier 38 and passes to the resonator 12, which in its first resonance mode generates an RF magnetic field $B_1{}^a$ at the sample 10.

When the sample 10 resonates, the resonator 12 in its second resonance mode, orthogonal to the first, receives a signal. This signal passes via the loop $L_b$ to the DC biassed diode detector 44; the output of the detector is a DC level depending on the amplitude of the resonance signal.

The field ramp controller 52 supplies a sawtooth waveform to the ZO coils 54; the field gradient applied by DC unit 48 to the field gradient coils 50 can be set at a selected fixed level.

In combination, the fields applied to the sample 10 are therefore:

a. the axial field $B_H$ provided by the magnet 22, b. a gradient magnetic field parallel to $B_H$ and provided by the gradient coils 50, c. a swept field, parallel to $B_H$, provided by the ZO coils 54 of the magnet; and d. a constant field $B_1{}^a$, perpendicular to field $B_H$, provided by one resonance mode of the birdcage resonator 12.

To record a spectrum the swept field is swept through an NM resonance of the sample 10, either from below or from above resonance. At magnetic resonance, i.e. when $$\omega = \gamma B_o$$

when ω is the RF angular frequency

γ is the gyromagnetic ratio of the nucleus to be detected in the sample 10, and $B_o$ is the (total local) magnetic field strength, the nuclear spins are disturbed from the Boltzmann population, and the nuclear magnetisation in the sample 10 starts to precess about the direction of $B_H$ at frequency ω, resulting in an RF signal being received by the resonator in its second mode of resonance.

To increase the sensitivity, a field modulation technique is used, the lock-in amplifier 46 generates a "reference" sinewave at a frequency $f_m$ which is much less than the RF frequency of generator 36; the reference sinewave is applied to the field modulation coils 26. When resonance is approached, the RF signal emitted by the resonator 12 through the coupling loop $L_b$ contains a component at frequency $f_m$ which remains on the output of the diode detector 44 and is fed to the input of lock-in amplifier 46; amplifier 46 contains a narrow-bandwidth filter, automatically centred on $f_m$, so that it is capable of recovering the modulated signal from large out-of-band noise signals.

In a test arrangement a 7 Tesla magnet 34 with 125 millimetre free bore within its shim/gradient coils 30 was used, and the field was swept by a value of 1.76 mili Tesla over 64 seconds in a sawtooth waveform. The birdcage resonator 12 was excited at 300.015 MHz, and a magnetic field modulation of 15 micro Tesla was applied at 881 Hertz through the field modulation coils 26. A field variation of 1.76 milli Tesla is equivalent to about 75 kHz proton frequency. The lock-in amplifier 46 had a time constant of 300 milliseconds.

The sample 10 had the form illustrated in FIG. 1, it comprised two blocks of vulcanised rubber 10A, 10B both 1.5 cm thick and 3 cm long, spaced 3.5 cm apart. The block 10A was of height 2.5 cm and the block 10B was of height 4 cm. The sample was placed in the resonator 12 of diameter 75 mm and length 90 mm with a 120 mm diameter copper shield 24.

The vulcanised rubber sample 10 had a $T_2$ of about 1 millisecond, which is relatively long in terms of the capabilities of the apparatus, and which could have been detected by known techniques, but was convenient for test purposes. The two rubber blocks were separated along the gradient direction, as shown.

Figure 4:
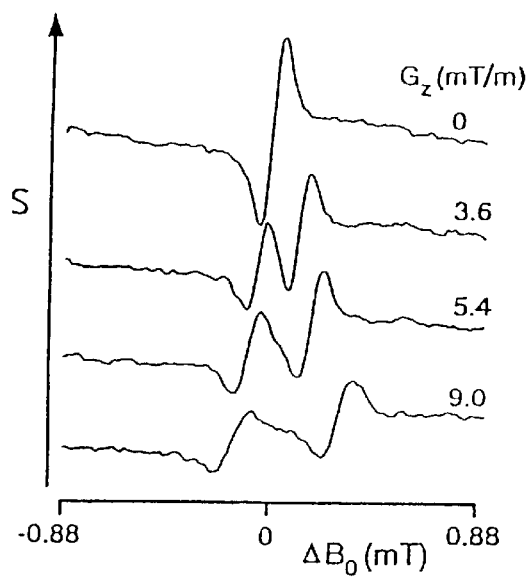
FIG. 4 illustrates the first derivative CW NMR spectra of the sample shown in FIG. 1.

FIG. 4 shows the first derivative NMR signal S obtained from the sample with magnetic field gradients $G_z$ of 0, 3.6, 5.4 and 9.0 milli Tesla per metre applied by coils 50.

It can clearly be seen that with zero gradient, a single line is obtained, while with the three non-zero gradients, two distinct lines are visible.

Figure 5:
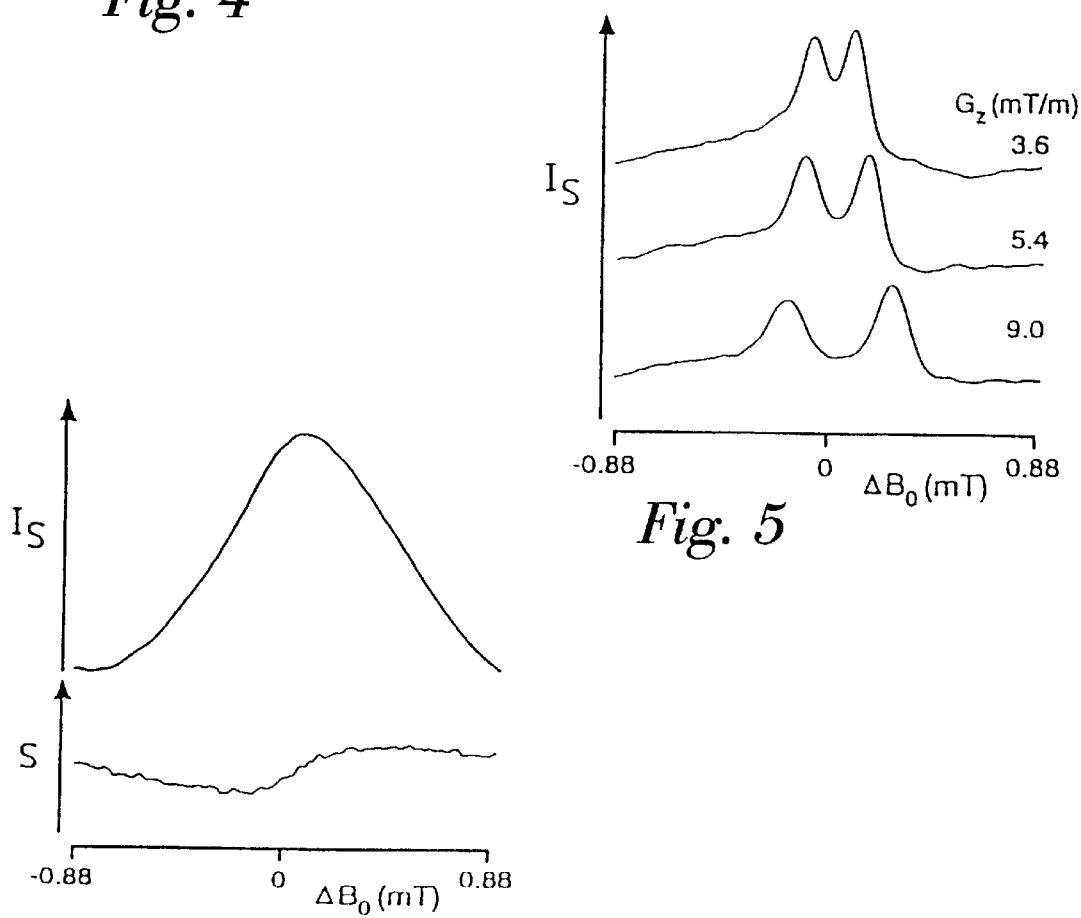
FIG. 5 is the integrated CW NMR spectra of the sample shown in FIG. 4.

FIG. 5 shows the integrated signal $I_S$. This was obtained by subtracting the zero gradient signal from each of the non-zero gradients; performing a linear base line correction; and performing integration. Such signal processing is conventional in EPR systems. The Figure indicates two peaks corresponding to the blocks 10A, 10B, with a spatial resolution increasing with the strength of the gradient. This can be calculated as the ratio of the zero gradient spectral line width to the field gradient intensity, and in the experiment the maximum spectral resolution was about 10 millimetres.

Figure 6:
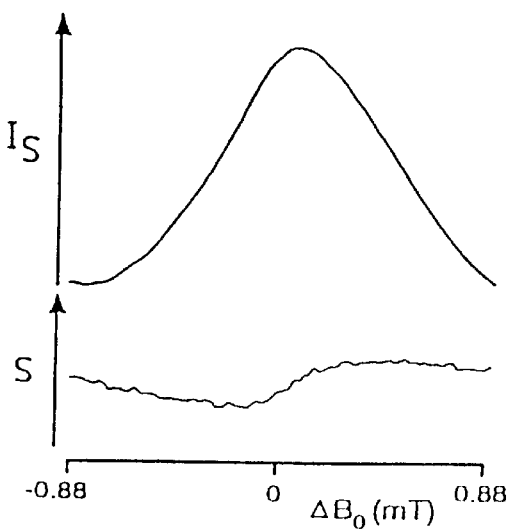
FIG. 6 shows the first derivative and integrated spectrum obtained from the apparatus illustrated in FIGS. 1, 2 and 3 in the absence of a sample.

FIG. 6 shows the spectrum with the sample 10 removed from the birdcage resonator 12; both the signal and the base line-corrected integral are shown. The signal arises from the PMMA former 14 supporting the birdcage resonator 12. Although the value of the RF magnetic field $B_{RF}$ in the centre of the resonator 12 was set at a low value (about 2 micro Tesla) appropriate to the relatively narrow proton resonance in rubber, the $B_{RF}$ field was inevitably concentrated close to the wires 16, 18 of the resonator, and was sufficient to give a reasonably intense signal from the former 14. Glassy polymers such as PMMA exhibit extremely short $T_2$ values (about 40 microseconds) and are particularly difficult to detect and image by conventional NMR techniques.

The parameters of the apparatus were not optimised for the detection either of the rubber NM resonance or for the PMMA resonance; particularly for the latter, a considerably larger modulation field should ideally be used to achieve optimum signal to noise ratio.

In alternative apparatus, the diode detector 38 may be replaced by a mixer and a reference arm. In a further alternative, use of a superheterodyne bridge configuration would give better sensitivity at low RF power levels.

It will be appreciated that the results given above relate only to a one-dimensional projection of the test object 10. To obtain two-dimensional or three-dimensional images, either the sample 10 can be rotated, or the field gradient can be rotated; either rotation can supply projections at a sufficient number of orientations through the sample 10 to permit signal analysis, for example by filtered back-projection or a similar technique, to reconstruct an image of the sample. If deconvolution of the projection spectra with the zero-gradient spectrum is required, as in FIG. 2, this would be carried out prior to back-projection. Such signal analysis techniques are conventional in NMR.

In the apparatus described above, the continuous magnetic field gradient is generated by use of the gradient coils of the magnet with DC power supplies. In an alternative, the stray field of a superconducting magnet can be used, as in the STRAFI technique, when the sample 10, resonator 12, field modulation coils 26, and field sweep coils 54 would be placed near the edge of the magnet bore.

In the apparatus described above, the magnetic field sweep is provided by ramping the magnetic field from the room-temperature ZO coil of the superconducting magnet. In an alternative, the field sweep may be generated by ramping the magnetic field of the superconducting magnet itself.

It is an advantage of swept field continuous wave NMR imaging that it allows the use of RF coils or resonators with extremely high Q-factors, because the detection circuitry need have only a very narrow bandwidth, of the order of 1 Hertz. The use of high Q-factor resonators increases the signal to noise ratio. If such a high Q resonator is to be used, it is advisable to incorporate automatic frequency control circuitry to ensure that any frequency drift of the resonator is followed by the RF source.

In an alternative apparatus, not illustrated, the superconducting magnet 34 is replaced by a resistive magnet of much lower field, for example 0.01 Tesla for operation at 300 MHz. All other parts of the apparatus are unchanged. The apparatus can now be operated by the technique of electron paramagnetic resonance to provide EPR spectroscopy and imaging.

What is claimed is:

1. Magnetic resonance apparatus for providing an image of a sample comprises:

first means for providing a magnetic field having:
   first, homogeneous component,
   a second, gradient component which varies in strength across the sample, and
   a third, swept component which varies in strength with time;

the second and third components being parallel to the first component and of substantially lower magnitude;

a birdcage resonator arranged within the magnetic field with its axis parallel to the field;

means to connect a radio-frequency source to the resonator so as to generate a magnetic field by a first resonance mode of the resonator; and means to connect detection means to the resonator so as to detect any signal received by the resonator in its second, orthogonal mode.

2. Magnetic resonance apparatus according to claim 1 in which the birdcage resonator is connected by inductive means to the radio-frequency source and the detection means.

3. Magnetic resonance apparatus according to claim 1 in which the birdcage resonator is connected by capacitive means to the radio-frequency source and the detection means.

4. Magnetic resonance apparatus according to claim 1 in which the apparatus comprises a superconducting magnet, and the means to provide the third component of the magnetic field comprises means to supply a ramp signal connected to the ZO coils of said superconducting magnet.

5. Magnetic resonance apparatus according to claim 1 arranged to provide an image by the technique of nuclear magnetic resonance.

6. Magnetic resonance apparatus according to claim 1 arranged to provide an image by the technique of electron paramagnetic resonance.

* * * * *